US008860426B2

(12) United States Patent
Kawamura

(10) Patent No.: US 8,860,426 B2
(45) Date of Patent: Oct. 14, 2014

(54) INSULATION STATE DETECTION CIRCUIT FOR UNGROUNDED POWER SOURCE

(75) Inventor: Yoshihiro Kawamura, Makinohara (JP)

(73) Assignee: Yazaki Corporation, Tokyo (JP)

( * ) Notice: Subject to any disclaimer, the term of this patent is extended or adjusted under 35 U.S.C. 154(b) by 94 days.

(21) Appl. No.: 13/701,560

(22) PCT Filed: Aug. 12, 2011

(86) PCT No.: PCT/JP2011/068730
§ 371 (c)(1),
(2), (4) Date: Dec. 3, 2012

(87) PCT Pub. No.: WO2012/023595
PCT Pub. Date: Feb. 23, 2012

(65) Prior Publication Data
US 2013/0082715 A1    Apr. 4, 2013

(30) Foreign Application Priority Data

Aug. 17, 2010   (JP) .................................. 2010-182219

(51) Int. Cl.
*G01R 31/14* (2006.01)
*G01R 31/02* (2006.01)
*G01R 27/18* (2006.01)
*G01R 31/00* (2006.01)

(52) U.S. Cl.
CPC ............ *G01R 31/021* (2013.01); *G01R 31/006* (2013.01); *G01R 31/025* (2013.01); *G01R 27/18* (2013.01)
USPC ........... 324/509; 324/510; 324/541; 324/544; 324/551

(58) Field of Classification Search
USPC ......... 324/500, 509, 537, 541, 544, 551, 510; 361/42
See application file for complete search history.

(56) References Cited

U.S. PATENT DOCUMENTS 5,818,236 A * 10/1998 Sone et al. ..................... 324/509
8,164,344 B2 * 4/2012 Yano et al. ..................... 324/510
(Continued)

FOREIGN PATENT DOCUMENTS

JP    2004-170137 A    6/2004
JP    2004-170141 A    6/2004
(Continued)

OTHER PUBLICATIONS

International Search Report (PCT/ISA/210) dated Nov. 22, 2011, issued by the International Searching Authority in International Application No. PCT/JP2011/068730.

(Continued)

*Primary Examiner* — Hoai-An D Nguyen
(74) *Attorney, Agent, or Firm* — Sughrue Mion, PLLC

(57) ABSTRACT

An insulation state detection circuit includes a first charging circuit, a second charging circuit and a third charging circuit. A charging resistance value in the case that a capacitor is charged in the first charging circuit coincides with a charging resistance value in the case that the capacitor is charged in the second charging circuit when a resistance value of the ground fault resistor of a negative terminal side of a DC power source is a ground fault alarm threshold value for an insulation state of an alarm level. The charging resistance value of the first charging circuit coincides with a charging resistance value in the case that the capacitor is charged in the third charging circuit when a resistance value of the ground fault resistor of the positive terminal side is a ground fault alarm threshold value for an insulation state of an alarm level.

3 Claims, 2 Drawing Sheets

(56) References Cited

U.S. PATENT DOCUMENTS

| | | | |
|---|---|---|---|
| 8,264,234 B2 * | 9/2012 | Yano et al. | 324/510 |
| 8,373,424 B2 * | 2/2013 | Kawamura | 324/548 |
| 8,373,950 B2 * | 2/2013 | Yano et al. | 361/42 |
| 2008/0079404 A1 | 4/2008 | Hayakawa et al. | |
| 2009/0289639 A1 | 11/2009 | Kawamura et al. | |
| 2009/0289640 A1 | 11/2009 | Kawamura et al. | |
| 2012/0081135 A1 | 4/2012 | Kawamura et al. | |
| 2012/0262183 A1 * | 10/2012 | Kawamura | 324/509 |

FOREIGN PATENT DOCUMENTS

| | | |
|---|---|---|
| JP | 2004-245632 A | 9/2004 |
| JP | 2007-170983 A | 7/2007 |
| JP | 2009-281986 A | 12/2009 |
| JP | 2009-281987 A | 12/2009 |

OTHER PUBLICATIONS

Written Opinion (PCT/ISA/237) dated Nov. 22, 2011, issued by the International Searching Authority, in International Application No. PCT/JP2011/068730.

Notification of Reasons for Refusal, dated May 20, 2014, issued by the Japanese Patent Office in counterpart Japanese Application No. 2010-182219.

Office Action dated Jun. 30, 2014 issued by the State Intellectual Property Office of P.R. China in corresponding Chinese Application No. 201180038856.2.

* cited by examiner

INSULATION STATE DETECTION CIRCUIT FOR UNGROUNDED POWER SOURCE

TECHNICAL FIELD

The present invention relates to a circuit for detecting an insulation state or a ground fault with respect to a ground potential portion of an ungrounded power source, and particularly to an insulation state detection circuit for an ungrounded power source for charging a flying capacitor and detecting an insulation state or a ground fault based on a charging voltage of the flying capacitor.

BACKGROUND ART

For example, in a vehicle using electric power as energy for propulsion, it is common to insulate a DC power source set at high voltage (for example, 200 V) from a vehicle body as an ungrounded power source. A detection circuit using a flying capacitor is used to detect an insulation state or a ground fault with respect to a ground potential portion of such an ungrounded power source.

In this detection circuit, the flying capacitor is respectively charged in the amount of electric charge according to a power source voltage of a DC power source insulated from the ground potential portion, the amount of electric charge according to a ground fault resistor of a positive terminal side of the DC power source and the amount of electric charge according to a ground fault resistor of a negative terminal side of the DC power source while switching an internal switch. Then, the respective charging voltages are measured in the controller side connected to the detection circuit, the ground fault or the insulation state can be detected by calculating the ground fault resistor of the positive terminal side and the ground fault resistor of the negative terminal side based on the measured value.

Incidentally, it is desirable to use a small ceramic capacitor with high capacity as the flying capacitor in recent years. In the ceramic capacitor, it is known that capacitance of the ceramic capacitor varies greatly depending on a DC bias. Hence, it is proposed to construct a detection circuit in which a charging voltage of a ceramic capacitor at the time when a ground fault resistor has a value of an alarm level becomes equal to a charging voltage by the amount of electric charge according to a power source voltage of a DC power source in order to eliminate the influence of a change in the capacitance due to the DC bias (for example, Patent Literature 1).

CITATION LIST

Patent Literature

[PTL 1] JP-A-2009-281986

SUMMARY OF INVENTION

Technical Problem

In the detection circuit described above, two resistors with the same resistance value are provided on a charging circuit for charging the ceramic capacitor with the DC power source in order to make the charging voltage of the ceramic capacitor at the time when the ground fault resistor has the value of the alarm level equal to the charging voltage by the amount of electric charge according to the power source voltage of the DC power source. Then, a part of the charging circuit for charging the ceramic capacitor in the amount of electric charge according to the ground fault resistor of the positive terminal side of the DC power source is constructed of one of the two resistors. Also, a part of the charging circuit for charging the ceramic capacitor in the amount of electric charge according to the ground fault resistor of the negative terminal side of the DC power source is constructed of the other of the two resistors.

Because of such construction, in the detection circuit described above, the alarm level of each of the ground fault resistors of the positive terminal side and the negative terminal side is inevitably set at the same value as the resistance value of the two resistors provided on the charging circuit for charging the ceramic capacitor with the DC power source. It is necessary to respectively set the resistance values of the two resistors at large values in order to ensure insulation of the ceramic capacitor against the DC power source in the case of measuring the charging voltage of the ceramic capacitor in order to obtain the ground fault resistors. As a result, the alarm levels of the ground fault resistors are forcedly set at large resistance values naturally.

The invention has been implemented in view of the circumstances described above, and an object of the invention is to provide an insulation state detection circuit of an ungrounded power source capable of setting an alarm level of a ground fault resistor at a small resistance value while ensuring properties of insulation against a DC power source in the case of measuring a charging voltage of a capacitor used as a flying capacitor such as the ceramic capacitor described above.

Solution to Problem

In order to achieve the object described above, there is provided an insulation state detection circuit of an ungrounded power source of the invention, comprising:

a first charging circuit that includes a first series circuit having a first resistor, a second resistor and a capacitor and charges the capacitor in an amount of electric charge according to a power source voltage of a DC power source insulated from a ground potential portion by connecting a positive terminal of the DC power source and a negative terminal of the DC power source through the first series circuit over a predetermined time;

a second charging circuit that includes a second series circuit having the first resistor and the capacitor and charges the capacitor in an amount of electric charge according to a ground fault resistor of a negative terminal side of the DC power source by connecting a main circuit wiring of the positive terminal side of the DC power source and the ground potential portion through the second series circuit over the predetermined time; and a third charging circuit that includes a third series circuit having the second resistor and the capacitor and charges the capacitor in an amount of electric charge according to a ground fault resistor of a positive terminal side of the DC power source by connecting a main circuit wiring of the negative terminal side of the DC power source and the ground potential portion over the predetermined time, wherein a charging resistance value in the case that the capacitor is charged in the first charging circuit coincides with a charging resistance value in the case that the capacitor is charged in the second charging circuit when a resistance value of the ground fault resistor of the negative terminal side is a ground fault alarm threshold value of the negative terminal side corresponding to an insulation state of an alarm level;

wherein the charging resistance value of the first charging circuit coincides with a charging resistance value in the case that the capacitor is charged in the third charging circuit when a resistance value of the ground fault resistor of the positive terminal side is a ground fault alarm threshold value of the positive terminal side corresponding to an insulation state of an alarm level;

wherein at least one of the second charging circuit and the third charging circuit includes an adjusting resistor which is not present in the first charging circuit; and wherein the adjusting resistor is connected in series with at least one of the second series circuit of the second charging circuit and the third series circuit of the third charging circuit.

According to the above configuration, each of the resistance values of the first and second resistors included in the first charging circuit is set at a high value in order to ensure properties of insulation from the DC power source in the case of measuring a charging voltage of the capacitor charged by the first to third charging circuits. Therefore, charging resistance of the second charging circuit at the time when the resistance value of the ground fault resistor of the negative terminal side is the corresponding ground fault alarm threshold value or charging resistance of the third charging circuit at the time when the resistance value of the ground fault resistor of the positive terminal side is the corresponding ground fault alarm threshold value also becomes a high resistance value like charging resistance of the first charging circuit.

At least one of the second charging circuit and the third charging circuit includes the adjusting resistor connected in series with the first series circuit of the first resistor or the second resistor and the capacitor. As a result, at least one of the second charging circuit and the third charging circuit can ensure the same charging resistance value as the charging resistance of the first charging circuit even when the ground fault alarm threshold value is made lower than the case of no adjusting resistor by a resistance value of the adjusting resistor. Hence, an alarm level of the ground fault resistor defined by the ground fault alarm threshold value can be set at a small resistance value while ensuring properties of insulation against the DC power source in the case of measuring the charging voltage of the capacitor.

Preferably, each of the second charging circuit and the third charging circuit includes the adjusting resistor, a resistance value of the first resistor is same as that of the second resistor, and a resistance value of the second charging circuit is same as that of the third charging circuit.

By the above configuration, adjusting circuits with the same resistance value are respectively connected in series with both the second and third series circuits of the second charging circuit and the third charging circuit, and a resistance value of the first resistor included in the second series circuit of the second charging circuit is same as that of the second resistor included in the third series circuit of the third charging circuit.

By the above configuration, the ground fault alarm threshold value corresponding to the ground fault resistor of the negative terminal side of the DC power source defined by the charging resistance value of the second charging circuit and the resistance values of the first resistor and the adjusting resistor becomes the same value as the ground fault alarm threshold value corresponding to the ground fault resistor of the positive terminal side of the DC power source defined by the charging resistance value of the third charging circuit and the resistance values of the second resistor and the adjusting resistor.

Hence, the alarm levels of the ground fault resistors defined by the ground fault alarm threshold values can be set at the same small resistance value in both of the positive terminal side and the negative terminal side of the DC power source while ensuring properties of insulation against the DC power source in the case of measuring the charging voltage of the capacitor.

Here, it is preferable that, either one of the second charging circuit and the third charging circuit includes the adjusting resistor.

By the above configuration, the adjusting resistor is connected in series with only the second series circuit of the second charging circuit or the third series circuit of the third charging circuit. Therefore, the ground fault alarm threshold value defined by the charging resistance value of the charging circuit in which the adjusting resistor is connected to the series circuit becomes a value different from the ground fault alarm threshold value defined by the charging resistance value of the charging circuit in which the adjusting resistor is not connected to the series circuit.

Hence, the alarm level of the ground fault resistor defined by the ground fault alarm threshold value can be set at the small resistance value selectively in any one of the positive terminal side and the negative terminal side of the DC power source while ensuring properties of insulation against the DC power source in the case of measuring the charging voltage of the capacitor.

Advantageous Effects of Invention

According to the insulation state detection circuit of the ungrounded power source of the invention, the alarm level of the ground fault resistor can be set at the small resistance value while ensuring properties of insulation against the DC power source in the case of measuring the charging voltage of the capacitor.

DESCRIPTION OF EMBODIMENTS

Embodiments of the invention will hereinafter be described with reference to the drawings.

First Embodiment

Figure 1:
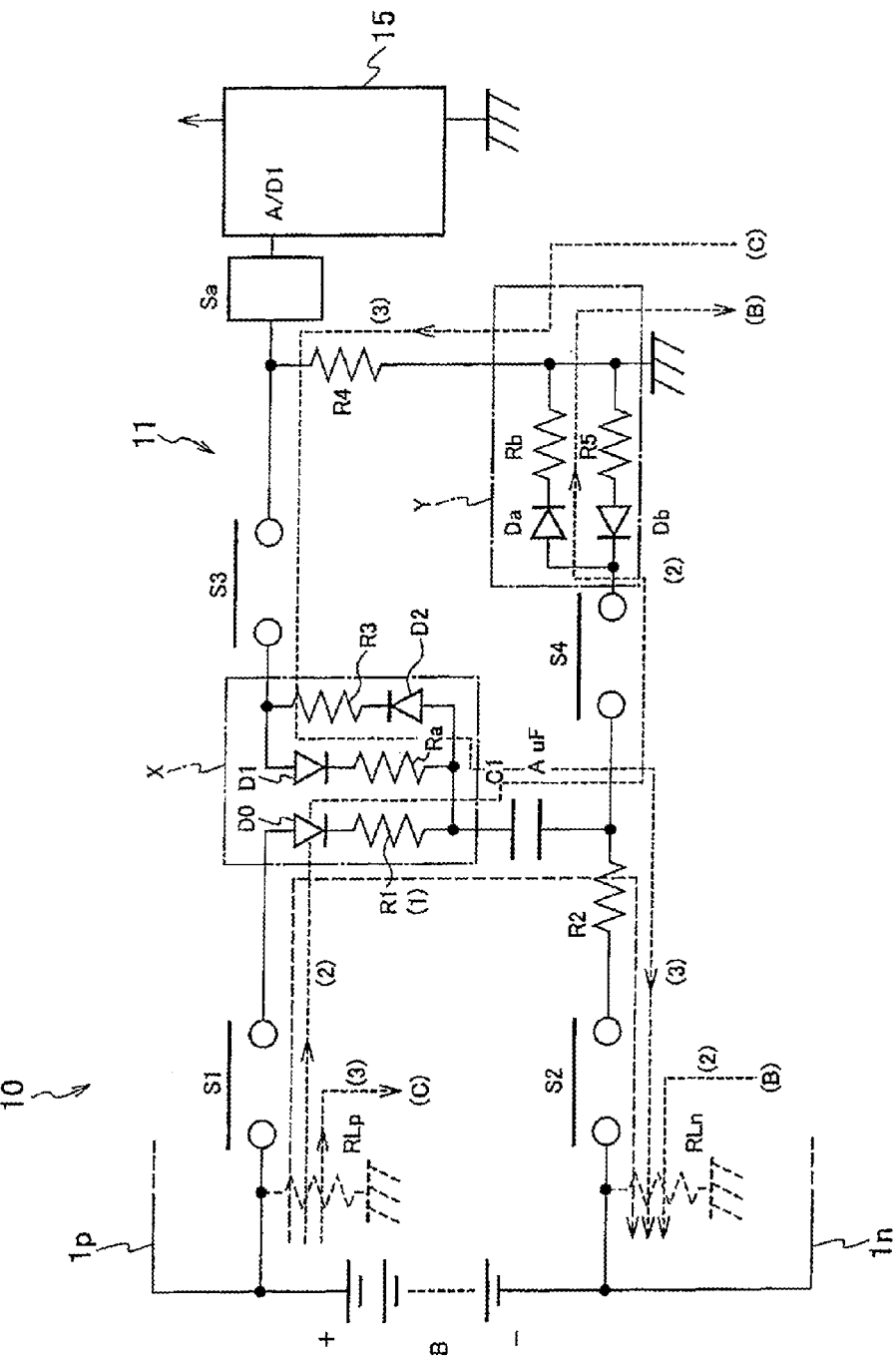
FIG. 1 is a circuit diagram showing a ground fault detecting unit having a ground fault detection circuit according to a first embodiment of the invention.

FIG. 1 is a circuit diagram showing a ground fault detecting unit having a ground fault detection circuit according to a first embodiment of the invention. The ground fault detection circuit of the present embodiment is a circuit for detecting an insulation state or a ground fault in a main circuit wiring $1n$ of the negative terminal side or a main circuit wiring $1p$ of the positive terminal side of a DC power source B insulated from a ground potential portion of a vehicle body and so on of a vehicle (not shown).

In FIG. 1, a reference numeral RLp is a ground fault resistor of the positive terminal side and a reference numeral RLn is a ground fault resistor of the negative terminal side, and the ground fault resistors are respectively virtual resistors in the case where ground faults occur in the main circuit wiring $1p$ of the positive terminal side and the main circuit wiring $1n$ of the negative terminal side.

A ground fault detecting unit 10 for detecting an insulation state or a ground fault of the main circuit wiring $1p$, $1n$ has a ground fault detection circuit (corresponding to an insulation state detection circuit of an ungrounded power source) 11 including a flying capacitor C1 (corresponding to a capacitor), and a microcomputer 15 for measuring a charging voltage of the flying capacitor C1. In the embodiment, a ceramic capacitor is used as the flying capacitor C1.

The ground fault detection circuit 11 has switches S1, S2 for respectively selectively connecting the flying capacitor C1 to a positive electrode and a negative electrode of the DC power source B, and switches S3, 84 for selectively connecting the flying capacitor C1 to the microcomputer 15 and the ground potential portion in addition to the flying capacitor C1. Resistors R1, R2 (corresponding to a first resistor and a second resistor) are respectively connected in series between the flying capacitor C1 and the switches S1, S2.

In addition, resistors with high resistance values of the same value are used as the resistors R1, R2 in order to ensure properties of insulation against the DC power source B in the case of measuring the charging voltage of the flying capacitor C1 by the microcomputer 15 described below.

The microcomputer 15 is operated by a power source (not shown) of a low-voltage system lower than the DC power source B, and the DC power source B is also insulated from a grounded electric potential of the microcomputer 15. Each of the switches S1 to S4 is constructed of, for example, an optical MOSFET, and is insulated from the DC power source B and is constructed so that on-off control can be performed by the microcomputer 15.

The microcomputer 15 is connected to the switch S3 through an (analog) switch or a sample hold circuit (hereinafter called "switch etc.") Sa. A point of connection between the switch etc. Sa and the switch S3 is grounded through a resistor R4, and a current direction switching circuit Y is connected between the switch S4 and the ground potential portion. Also, the switches S1, 83 of the side of one end (an upper electrode in FIG. 1) of the flying capacitor C1 are connected in series, and a current direction switching circuit X is connected between one end of the flying capacitor C1 and a point of connection between both the switches S1, S3, The current direction switching circuit X is a parallel circuit, and the first circuit in the parallel circuit has a series circuit of the resistor R1 and a diode D0 set in a forward direction from the switch S1 toward one end of the flying capacitor C1, and the second circuit in the parallel circuit has a series circuit of a resistor Ra (corresponding to an adjusting resistor) and a diode D1 set in a forward direction from the switch S3 toward one end of the flying capacitor C1, and the last circuit in the parallel circuit has a series circuit of a resistor R3 and a diode D2 set in a forward direction from one end of the flying capacitor C1 toward the switch S3.

Also, the current direction switching circuit Y is a parallel circuit, and the first circuit in the parallel circuit has a series circuit of a resistor Rb (corresponding to an adjusting resistor) and a diode Da set in a forward direction from the switch S4 toward the ground potential portion, and the second circuit in the parallel circuit has a series circuit of a resistor R5 and a diode Db set in a forward direction from the ground potential portion toward the switch S4. A resistance value of the resistor Rb is the same resistance value as the resistor Ra of the current direction switching circuit X.

In the ground fault detecting unit 10 described above, when a ground fault or an insulation state is detected, the switches S1, S2 are turned on and also the switches S3, S4 are turned off over a predetermined time under control of the microcomputer 15. Here, the predetermined time is time shorter than the time taken to fully charge the flying capacitor C1.

Consequently, a charging circuit ranging from the positive electrode of the DC power source B to the negative electrode of the DC power source B through the main circuit wiring 1p of the positive terminal side, the switch S1, the diode D0, the resistor R1, one end (the upper electrode in FIG. 1) of the flying capacitor C1, the other end (a lower electrode in FIG. 1) of the flying capacitor C1, the resistor R2, the switch S2 and the main circuit wiring in of the negative terminal side is formed. Hereinafter, this charging circuit is called a first charging circuit.

Then, in this first charging circuit, the flying capacitor C1 is charged in the amount of electric charge according to a voltage of the DC power source B. By this charging, one end of the flying capacitor C1 forms a positive electrode and the other end of the flying capacitor C1 forms a negative electrode.

Subsequently, the switches S1, S2 are turned off and also the switches S3, S4 are turned on by control of the microcomputer 15. Consequently, the positive electrode of the flying capacitor C1 is connected to the switch etc. Sa through the diode D2, the resistor R3 and the switch S3, and the negative electrode of the flying capacitor C1 is connected to the ground potential portion through the switch S4, the diode Db and the resistor R5. Then, an electric potential corresponding to a difference in the voltage across the resistor R3 in which the charging voltage of the flying capacitor C1 is divided by the resistors R3, R4 is input to a first A/D conversion port A/D1 of the microcomputer 15 through the switch etc. Sa and is measured. From this measured value and a voltage division ratio of the resistors R3, R4, a charging voltage Vc1 of the flying capacitor C1 according to a voltage of the DC power source B is measured by the microcomputer 15.

Then, after the flying capacitor C1 is fully discharged, the switches S1, S4 are turned on and also the switches S2, S3 are turned off over the predetermined time described above by control of the microcomputer 15. Consequently, a charging circuit ranging from the positive electrode of the DC power source B to the negative electrode of the DC power source B through the main circuit wiring 1p of the positive terminal side, the switch S1, the diode D0, the resistor R1, one end of the flying capacitor C1, the other end of the flying capacitor C1, the switch S4, the diode Da, the resistor Rb, (the ground potential portion), the ground fault resistor RLn of the negative terminal side and the main circuit wiring 1n of the negative terminal side is formed. Hereinafter, this charging circuit is called a second charging circuit.

Then, in this second charging circuit, the flying capacitor C1 is charged in the amount of electric charge according to the ground fault resistor RLn of the negative terminal side. By this charging, one end of the flying capacitor C1 forms a positive electrode and the other end of the flying capacitor C1 forms a negative electrode.

Subsequently, by control of the microcomputer 15 shown in FIG. 1, the switches S1, S2 are turned off and also the switches S3, S4 are turned on, and the same measuring circuit as the case of measuring the charging voltage Vc1 of the flying capacitor C1 according to the voltage of the DC power source B is formed. Then, using this measuring circuit, a charging voltage Vc1− of the flying capacitor C1 according to the ground fault resistor RLn of the negative terminal side is measured by the microcomputer 15.

Then, after the flying capacitor C1 is fully discharged, the switches S2, S3 are turned on and also the switches S1, S4 are turned off over the predetermined time described above by control of the microcomputer 15. Consequently, a charging circuit ranging from the positive electrode of the DC power source B to the negative electrode of the DC power source B through the main circuit wiring $1p$ of the positive terminal side, the ground fault resistor RLp of the positive terminal side, (the ground potential portion), the resistor R4, the switch S3, the diode D1, the resistor Ra, one end of the flying capacitor C1, the other end of the flying capacitor C1, the resistor R2, the switch S2 and the main circuit wiring $1n$ of the negative terminal side is formed. Hereinafter, this charging circuit is called a third charging circuit.

Then, in this third charging circuit, the flying capacitor C1 is charged in the amount of electric charge according to the ground fault resistor RLp of the positive terminal side. By this charging, one end of the flying capacitor C1 forms a positive electrode and the other end of the flying capacitor C1 forms a negative electrode.

Subsequently, by control of the microcomputer 15, the switches S1, S2 are turned off and also the switches S3, S4 are turned on, and the same measuring circuit as the case of measuring the charging voltage Vc1 of the flying capacitor C1 according to the voltage of the DC power source B or the case of measuring the charging voltage Vc1− of the flying capacitor C1 according to the ground fault resistor RLn of the negative terminal side is formed. Then, using this measuring circuit, a charging voltage Vc1+ of the flying capacitor C1 according to the ground fault resistor RLp of the positive terminal side is measured by the microcomputer 15. Then, the flying capacitor C1 is fully discharged.

Incidentally, there is a relation between a parallel combined resistance value $R=(RLp+RLn)/(RLp\times RLn)$ of the ground fault resistor RLp of the positive terminal side and the ground fault resistor RLn of the negative terminal side and the charging voltage Vc1 of the flying capacitor C1 according to the voltage of the DC power source B, the charging voltage Vc1− of the flying capacitor C1 according to the ground fault resistor RLn of the negative terminal side and the charging voltage Vc1+ of the flying capacitor C1 according to the ground fault resistor RLp of the positive terminal side as shown in the following relational expression.

$$(RLp+RLn)/(RLp\times RLn)=\{(Vc1+)+(Vc1-)\}/Vc1$$

Hence, the microcomputer 15 can detect an insulation state or a ground fault of the DC power source B by calculating the parallel combined resistance value of the ground fault resistors RLp, RLn of the positive terminal side and the negative terminal side using the relational expression described above.

In addition, in the ceramic capacitor used as the flying capacitor C1 in the ground fault detection circuit 11 of the embodiment, capacitance varies greatly depending on a DC bias. Hence, the ground fault detection circuit 11 is configured so that the following relation holds in charging resistance values in the case where the first to third charging circuits respectively charge the flying capacitor C1 in the embodiment in order to eliminate the influence of a change in capacitance due to the DC bias.

That is, a charging resistance value of the second charging circuit at the time when a resistance value of the ground fault resistor RLn of the negative terminal side is a ground fault resistor threshold value of the negative terminal side corresponding to an insulation state of an alarm level is configured so as to coincide with a charging resistance value of the first charging circuit. Also, a charging resistance value of the third charging circuit at the time when a resistance value of the ground fault resistor RLp of the positive terminal side is a ground fault resistor threshold value of the positive terminal side corresponding to an insulation state of an alarm level is configured so as to coincide with the charging resistance value of the first charging circuit.

Here, the charging resistance value of the first charging circuit becomes the sum of each of the resistance values of the resistor R1 and the resistor R2 present in series on the first charging circuit. On the other hand, the charging resistance value of the second charging circuit becomes the sum of each of the resistance values of the resistor R1, the resistor Rb and the ground fault resistor RLn of the negative terminal side present in series on the second charging circuit. Then, since the charging resistance value of the first charging circuit is equal to the charging resistance value of the second charging circuit at the time when the resistance value of the ground fault resistor RLn of the negative terminal side is a ground fault resistor threshold value $\alpha$ of the negative terminal side, the following formula holds.

$$R1+R2=R1+Rb+\alpha$$

Arrangement of the above formula obtains the following formula.

$$R2=Rb+\alpha$$

Therefore, in the ground fault detection circuit 11 of the embodiment, in order to ensure properties of insulation against the DC power source B in the case of measuring the charging voltage of the flying capacitor C1 by the microcomputer 15, even when the resistance value of the resistor R2 is set high, the ground fault resistor threshold value $\alpha$ of the negative terminal side can be set at a low resistance value in which the resistance value of the resistor Rb is subtracted from the resistance value of the resistor R2.

Also, the charging resistance value of the third charging circuit becomes the sum of each of the resistance values of the ground fault resistor RLp of the positive terminal side, the resistor R4, the resistor Ra and the resistor R2 present in series on the third charging circuit. Then, since the charging resistance value of the first charging circuit is equal to the charging resistance value of the third charging circuit at the time when the ground fault resistor RLp of the positive terminal side has a ground fault resistor threshold value $\beta$ of the positive terminal side, the following formula holds.

$$R1+R2=\beta+R4+Ra+R2$$

Arrangement of the above formula obtains the following formula.

$$R1=\beta+R4+Ra$$

Here, the resistor R4 on the third charging circuit is very smaller than the resistor R1, the resistor R2, the resistor Ra and the ground fault resistor threshold value $\beta$ of the positive terminal side and is negligible, so that further arrangement of the above formula obtains the following formula.

$$R1=\beta+Ra$$

Therefore, in the ground fault detection circuit 11 of the embodiment, in order to ensure properties of insulation against the DC power source B in the case of measuring the charging voltage of the flying capacitor C1 by the microcomputer 15, even when the resistance value of the resistor R1 is set high, the ground fault resistor threshold value $\beta$ of the positive terminal side can be set at a low resistance value in which the resistance value of the resistor Ra is subtracted from the resistance value of the resistor R1.

Figure 2:
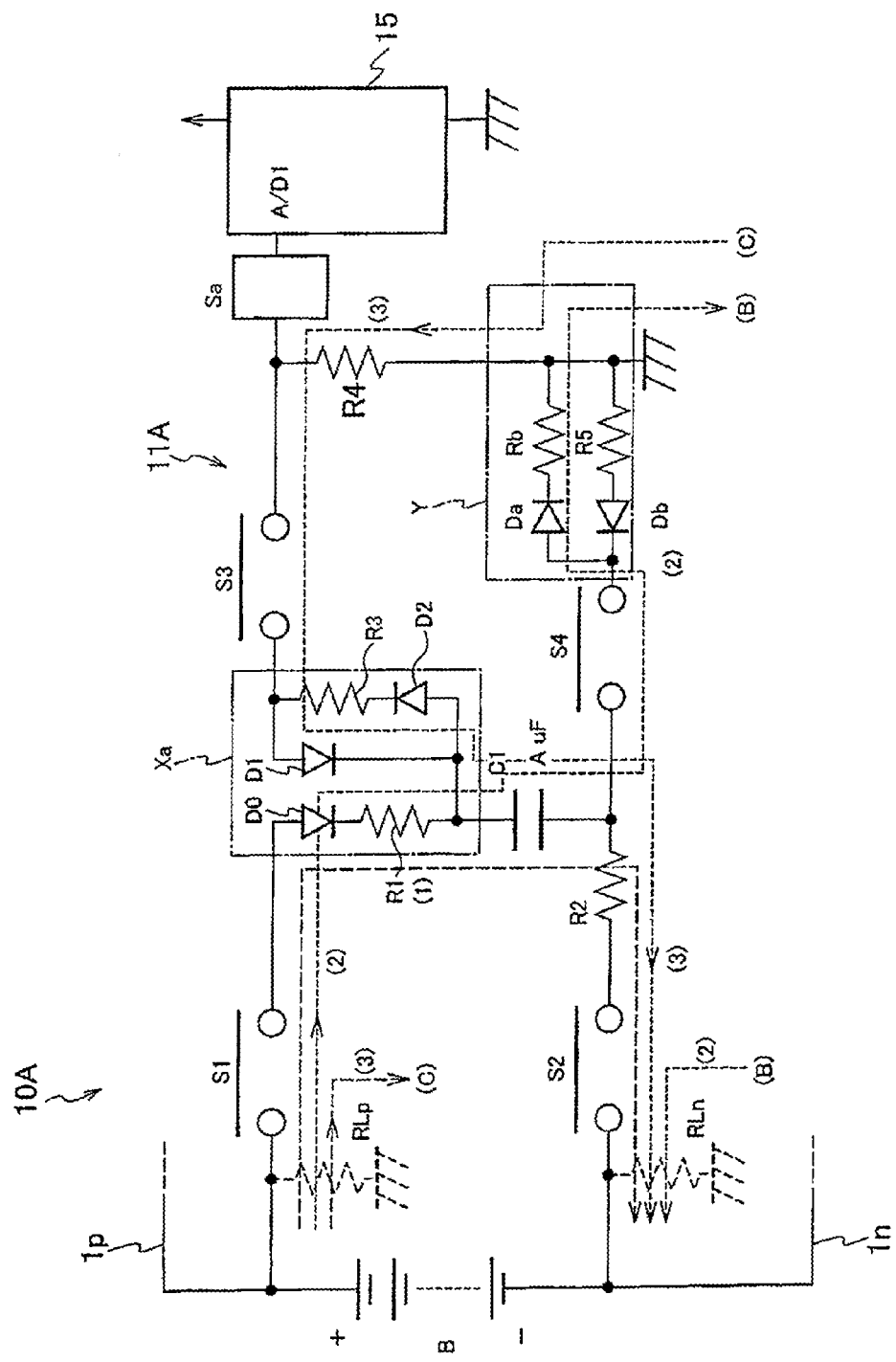
FIG. 2 is a circuit diagram showing a ground fault detecting unit having a ground fault detection circuit according to a second embodiment of the invention.

In addition, the resistor R1 has the same resistance value as the resistor R2, and the resistor Ra also has the same resistance value as the resistor Rb, so that the ground fault resistor threshold value $\alpha$ of the negative terminal side becomes the same resistance value as the ground fault resistor threshold value $\beta$ of the positive terminal side in the ground fault detection circuit 11 of the embodiment. As a result, in both of the positive terminal side and the negative terminal side of the DC power source B, the ground fault resistor threshold values α, β can be set at resistance values lower than the resistors R1, R2 having high resistance values in order to ensure properties of insulation of the flying capacitor against the DC power source B. Consequently, a ground fault or an insulation state can be detected with reference to the low resistance value while ensuring properties of insulation of the flying capacitor against the DC power source B, Second Embodiment Next, a second embodiment of the invention will be described, FIG. 2 is a circuit diagram showing a ground fault detecting unit having a ground fault detection circuit according to the second embodiment of the invention. A ground fault detecting unit 10A of the present embodiment is provided with a ground fault detection circuit 11A instead of the ground fault detection circuit 11 of the ground fault detecting unit 10 of the first embodiment. A configuration of the ground fault detecting unit 10A except the ground fault detection circuit 11A is the same as the configuration except the ground fault detection circuit 11 of the ground fault detecting unit 10 of the first embodiment.

In the ground fault detection circuit 11A, a configuration of a current direction switching circuit Xa connected between one end of a flying capacitor C1 and a point of connection between switches S1, S3 slightly differs from that of the current direction switching circuit X of the ground fault detection circuit 11 of the first embodiment. A configuration of the ground fault detection circuit 11A except the current direction switching circuit Xa is the same as the configuration of the ground fault detection circuit 11 except the current direction switching circuit X of the first embodiment.

Then, the current direction switching circuit Xa has the configuration in which the resistor Ra connected in series with the diode D1 is omitted in the current direction switching circuit X of the first embodiment.

In the ground fault detecting unit 10A of the present embodiment having the ground fault detection circuit 11A configured thus, a microcomputer 15 performs switching control of switches S1 to S4 similar to switching control performed in the ground fault detecting unit 10 of the first embodiment.

As a result, in a first charging circuit formed by the microcomputer 15 which turns on the switches S1, S2 and also turns off the switches S3, S4 over a predetermined time, the flying capacitor C1 is charged in the amount of electric charge according to a voltage of a DC power source B. Thereafter, the microcomputer 15 turns off the switches S1, S2 and turns on the switches S3, S4 and thereby, a charging voltage Vc1 of the flying capacitor C1 according to the voltage of the DC power source B is measured by the microcomputer 15.

Also, in a second charging circuit formed by the microcomputer 15 which turns on the switches S1, S4 and also turns off the switches S2, S3 over the predetermined time after the flying capacitor C1 is fully discharged, the flying capacitor C1 is charged in the amount of electric charge according to a ground fault resistor RLn of the negative terminal side. Thereafter, the microcomputer 15 turns off the switches S1, S2 and turns on the switches S3, S4 and thereby, a charging voltage Vc1− of the flying capacitor C1 according to the ground fault resistor RLn of the negative terminal side is measured by the microcomputer 15.

Further, in a third charging circuit formed by the microcomputer 15 which turns on the switches S2, S3 and also turns off the switches S1, S4 over the predetermined time after the flying capacitor C1 is fully discharged, the flying capacitor C1 is charged in the amount of electric charge according to a ground fault resistor RLp of the positive terminal side. Thereafter, the microcomputer 15 turns off the switches S1, S2 and turns on the switches S3, S4 and thereby, a charging voltage Vc1+ of the flying capacitor C1 according to the ground fault resistor RLp of the positive terminal side is measured by the microcomputer 15.

Then, in the embodiment, a charging resistance value of the third charging circuit becomes the sum of each of the resistance values of the ground fault resistor RLp of the positive terminal side, a resistor R4 and a resistor R2 present in series on the third charging circuit. Therefore, in the case of assuming that a charging resistance value of the first charging circuit is equal to the charging resistance value of the third charging circuit at the time when the ground fault resistor RLp of the positive terminal side has a ground fault resistor threshold value β of the positive terminal side, the following formula holds.

$$R1+R2=\beta+R4+R2$$

Arrangement of the above formula obtains the following formula.

$$R1=\beta+R4$$

Here, the resistor R4 on the third charging circuit is very smaller than a resistor R1, the resistor R2 and the ground fault resistor threshold value β of the positive terminal side and is negligible, so that further arrangement of the above formula obtains the following formula.

$$R1=\beta$$

Therefore, in the ground fault resistor RLn of the negative terminal side present on the second charging circuit having a resistor Rb in the ground fault detection circuit 11A of the embodiment, a corresponding ground fault resistor threshold value α of the negative terminal side can be set at a resistance value lower than the resistor R2 or the resistor R1 having a high resistance value by the amount in which a resistance value of the resistor Rb is subtracted. On the other hand, in the ground fault resistor RLp of the positive terminal side present on the third charging circuit in which the resistor Ra is omitted, the corresponding ground fault resistor threshold value β of the positive terminal side is set at the same resistance value as the resistor R1 having the high resistance value.

Hence, using the ground fault resistor threshold value α of the negative terminal side corresponding to the ground fault resistor RLn of the negative terminal side and the ground fault resistor threshold value β of the positive terminal side corresponding to the ground fault resistor RLp of the positive terminal side as respectively individual values, sensitivity of detection of a ground fault or an insulation state can be changed in the positive terminal side and the negative terminal side.

In addition, instead of constructing the current direction switching circuit Xa by omitting the resistor Ra from the current direction switching circuit X of the first embodiment, a current direction switching circuit in which the resistor Rb is omitted from a current direction switching circuit Y may be constructed so as to be used instead of the current direction switching circuit Y of the first embodiment.

Also in the case of such construction, an effect similar to the ground fault detection circuit 11A of the second embodiment can be obtained except that the possibility of being set at a low resistance value changes from the ground fault resistor threshold value α of the negative terminal side to the ground fault resistor threshold value β of the positive terminal side, The present application is based on Japanese Patent Application No. 2010-182219 filed on Aug. 17, 2010, the contents of which are incorporated herein by reference.

INDUSTRIAL APPLICABILITY

An insulation state detection circuit of an ungrounded power source capable of setting an alarm level of a ground fault resistor at a small resistance value while ensuring properties of insulation against a DC power source in the case of measuring a charging voltage of a capacitor used as a flying capacitor such as a ceramic capacitor can be provided.

REFERENCE SIGNS LIST

1n MAIN CIRCUIT WIRING
1p MAIN CIRCUIT WIRING
10 GROUND FAULT DETECTING UNIT
10A GROUND FAULT DETECTING UNIT
11 GROUND FAULT DETECTION CIRCUIT
11A GROUND FAULT DETECTION CIRCUIT
15 MICROCOMPUTER
A/D1 ND CONVERSION PORT
B DC POWER SOURCE
C1 FLYING CAPACITOR (CAPACITOR)
D0 DIODE
D1 DIODE
D2 DIODE
Da DIODE
Db DIODE
RLn GROUND FAULT RESISTOR OF NEGATIVE TERMINAL SIDE
RLp GROUND FAULT RESISTOR OF POSITIVE TERMINAL SIDE
R1 RESISTOR (FIRST RESISTOR, FIRST CHARGING CIRCUIT, SECOND CHARGING CIRCUIT)
R2 RESISTOR (SECOND RESISTOR, FIRST CHARGING CIRCUIT, THIRD CHARGING CIRCUIT)
R3 RESISTOR
R4 RESISTOR (THIRD CHARGING CIRCUIT)
R5 RESISTOR
Ra RESISTOR (ADJUSTING RESISTOR, THIRD CHARGING CIRCUIT)
Rb RESISTOR (ADJUSTING RESISTOR, SECOND CHARGING CIRCUIT)
S1 SWITCH
S2 SWITCH
S3 SWITCH
S4 SWITCH
Sa (ANALOG) SWITCH OR SAMPLE HOLD CIRCUIT
X CURRENT DIRECTION SWITCHING CIRCUIT
Xa CURRENT DIRECTION SWITCHING CIRCUIT
Y CURRENT DIRECTION SWITCHING CIRCUIT

The invention claimed is:

1. An insulation state detection circuit for an ungrounded power source, comprising:
a first charging circuit that includes a first series circuit having a first resistor, a second resistor and a capacitor and charges the capacitor in an amount of electric charge according to a power source voltage of a DC power source insulated from a ground potential portion by connecting a positive terminal of the DC power source and a negative terminal of the DC power source through the first series circuit over a predetermined time;
a second charging circuit that includes a second series circuit having the first resistor and the capacitor and charges the capacitor in an amount of electric charge according to a ground fault resistor of a negative terminal side of the DC power source by connecting a main circuit wiring of the positive terminal side of the DC power source and the ground potential portion through the second series circuit over the predetermined time; and
a third charging circuit that includes a third series circuit having the second resistor and the capacitor and charges the capacitor in an amount of electric charge according to a ground fault resistor of a positive terminal side of the DC power source by connecting a main circuit wiring of the negative terminal side of the DC power source and the ground potential portion over the predetermined time,
wherein a charging resistance value in the case that the capacitor is charged in the first charging circuit coincides with a charging resistance value in the case that the capacitor is charged in the second charging circuit when a resistance value of the ground fault resistor of the negative terminal side is a ground fault alarm threshold value of the negative terminal side corresponding to an insulation state of an alarm level;
wherein the charging resistance value of the first charging circuit coincides with a charging resistance value in the case that the capacitor is charged in the third charging circuit when a resistance value of the ground fault resistor of the positive terminal side is a ground fault alarm threshold value of the positive terminal side corresponding to an insulation state of an alarm level;
wherein at least one of the second charging circuit and the third charging circuit includes an adjusting resistor which is not present in the first charging circuit; and
wherein the adjusting resistor is connected in series with at least one of the second series circuit of the second charging circuit and the third series circuit of the third charging circuit.

2. The insulation state detection circuit according to claim 1, wherein each of the second charging circuit and the third charging circuit includes the adjusting resistor;
wherein a resistance value of the first resistor is same as that of the second resistor; and
wherein a resistance value of the second charging circuit is same as that of the third charging circuit.

3. The insulation state detection circuit according to claim 1, wherein either one of the second charging circuit and the third charging circuit includes the adjusting resistor.

* * * * *